(12) United States Patent
Mou et al.

(10) Patent No.: US 11,754,200 B2
(45) Date of Patent: Sep. 12, 2023

(54) MINIATURE TRANSPORTATION DEVICE

(71) Applicant: Microjet Technology Co., Ltd., Hsinchu (TW)

(72) Inventors: Hao-Jan Mou, Hsinchu (TW); Chi-Feng Huang, Hsinchu (TW); Yung-Lung Han, Hsinchu (TW); Chun-Yi Kuo, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 697 days.

(21) Appl. No.: 16/414,096

(22) Filed: May 16, 2019

(65) Prior Publication Data

US 2019/0353157 A1    Nov. 21, 2019

(30) Foreign Application Priority Data

May 21, 2018   (TW) .................................. 107117277

(51) Int. Cl.
| | |
|---|---|
| *F16K 99/00* | (2006.01) |
| *F04B 43/04* | (2006.01) |
| *F04B 13/00* | (2006.01) |
| *F04B 45/047* | (2006.01) |
| *B81B 7/02* | (2006.01) |

(52) U.S. Cl.
CPC .......... *F16K 99/0015* (2013.01); *F04B 13/00* (2013.01); *F04B 43/046* (2013.01); *F04B 45/047* (2013.01); *F16K 99/0048* (2013.01); *B81B 7/02* (2013.01)

(58) Field of Classification Search
CPC ........ F04B 43/04; F04B 43/043; F04B 43/02; F04B 43/002; F04B 43/00; F04B 43/0009; F04B 43/0027; F04B 43/046

USPC ...................................................... 417/410.2
See application file for complete search history.

(56) References Cited

U.S. PATENT DOCUMENTS

| | | | | |
|---|---|---|---|---|
| 2009/0232684 | A1* | 9/2009 | Hirata | F04B 43/046 |
| | | | | 417/413.2 |
| 2014/0377099 | A1* | 12/2014 | Hsueh | F04B 49/22 |
| | | | | 417/413.2 |

FOREIGN PATENT DOCUMENTS

| | | |
|---|---|---|
| CN | 102046978 A | 5/2011 |
| CN | 102979703 A | 3/2013 |
| CN | 102979705 A | 3/2013 |

(Continued)

*Primary Examiner* — Philip E Stimpert
(74) *Attorney, Agent, or Firm* — BIRCH, STEWART, KOLASCH & BIRCH, LLP

(57) ABSTRACT

A miniature transportation device is disclosed and includes a gas inlet plate, a resonance plate and a piezoelectric actuator, which are stacked on each other sequentially. The gas inlet plate comprises at least one inlet, at least one convergence channel and a convergence chamber. The convergence channel is in fluid communication with the inlet and the convergence channel. The resonance plate comprises a central aperture. A chamber gap is formed between the resonance plate and the piezoelectric actuator to define a first chamber. When the piezoelectric actuator is enabled, the gas is fed into the miniature gas transportation device through the inlet of the gas inlet plate, converged to the convergence chamber through the convergence channel, transferred through the central aperture of the resonance plate, introduced into the first chamber, and transferred along a transportation direction through a vacant space of the piezoelectric actuator to be discharged continuously.

14 Claims, 13 Drawing Sheets

(56) References Cited

FOREIGN PATENT DOCUMENTS

| | | |
|---|---|---|
| CN | 205383064 U | 7/2016 |
| CN | 206035774 U | 3/2017 |
| CN | 206211877 U | 5/2017 |
| DE | 10033576 A1 * | 2/2001 ............ H04R 17/00 |
| JP | 63-9481 U | 1/1988 |
| JP | 4-101082 A | 4/1992 |
| JP | 2001-323879 A | 11/2001 |
| JP | 2013-100746 A | 5/2013 |
| JP | 2017-133515 A | 8/2017 |
| TW | 201217647 A | 5/2012 |
| TW | M537586 U | 3/2017 |
| TW | M538546 U | 3/2017 |
| WO | WO 2013/084909 A1 | 6/2013 |

\* cited by examiner

MINIATURE TRANSPORTATION DEVICE

FIELD OF THE INVENTION

The present disclosure relates to a miniature transportation device, and more particularly to a slim and silent miniature transportation device.

BACKGROUND OF THE INVENTION

Currently, in all fields, the products used in many sectors such as pharmaceutical industries, computer techniques, printing industries or energy industries are developed toward elaboration and miniaturization. The fluid transportation devices are important components that are used in for example micro pumps, micro atomizers, printheads or the industrial printers. Therefore, how to utilize an innovative miniaturized fluid transportation structure to break through the bottleneck of the prior art has become an important part of development.

For example, in the pharmaceutical industries, control devices or control apparatuses, which use pneumatic power, employ motors and pressure valves to transport gases. However, due to the structure limitations of the motors and the pressure valves, the control devices or the control apparatuses are bulky in volume. In other words, the conventional control device fails to meet the miniaturization requirement, and is not suitable to be installed in or cooperate with a portable equipment. Moreover, during operations of the motor and the pressure valve, annoying noise is readily generated, which make the user anxious. It leads to inconvenience and discomfort in use.

However, miniaturization will increase the difficulty of the assembling process of the miniature transportation device. It should be understood that the gaps between the elements of the miniature transportation device will influence the efficiency of transportation. Therefore, there is a need of providing a miniature transportation device having miniature structure and precisely controlled gaps between the elements thereof in order to eliminate the above drawbacks.

SUMMARY OF THE INVENTION

An object of the present disclosure provides a miniature transportation device for use with a portable or wearable equipment or apparatus.

In accordance with an aspect of the present disclosure, a miniature transportation device is provided. The miniature transportation device includes a gas inlet plate, a resonance plate and a piezoelectric actuator. The gas inlet plate includes at least one inlet, at least one convergence channel and a convergence chamber. The at least one inlet is configured to introduce gas into the miniature transportation device. A first end of the at least one convergence channel is in fluid communication with the at least one inlet, and a second end of the at least one convergence channel is in fluid communication with the convergence channel, so that the gas fed from the at least one inlet is converged to the convergence chamber. The resonance plate includes a central aperture spatially corresponding to the convergence chamber of the gas inlet plate. The piezoelectric actuator includes a suspension plate, an outer frame, at least one bracket and a piezoelectric element. The suspension plate has a diameter in the range between 4 mm and 8.5 mm and includes a first surface and a second surface. The outer frame surrounds the periphery of the suspension plate and includes an assembling surface and a bottom surface. The bracket is connected between the suspension plate and the outer frame to provide elastic support for the suspension plate. The piezoelectric element is attached on the first surface of the suspension plate. The resonance plate is stacked on the assembling surface of the outer frame, and the gas inlet plate is stacked on the resonance plate, so that the gas inlet plate, the resonance plate and the piezoelectric actuator are stacked on each other sequentially. A chamber gap is formed between the resonance plate and the piezoelectric actuator to define a first chamber. When the piezoelectric actuator is enabled, the gas is fed through the at least one inlet of the gas inlet plate into the miniature gas transportation device, converged through the at least one convergence channel to the convergence chamber, transferred through the central aperture of the resonance plate, introduced into the first chamber, and transferred along a transportation direction through at least one vacant space of the piezoelectric actuator to be discharged continuously.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

Figure 1A:
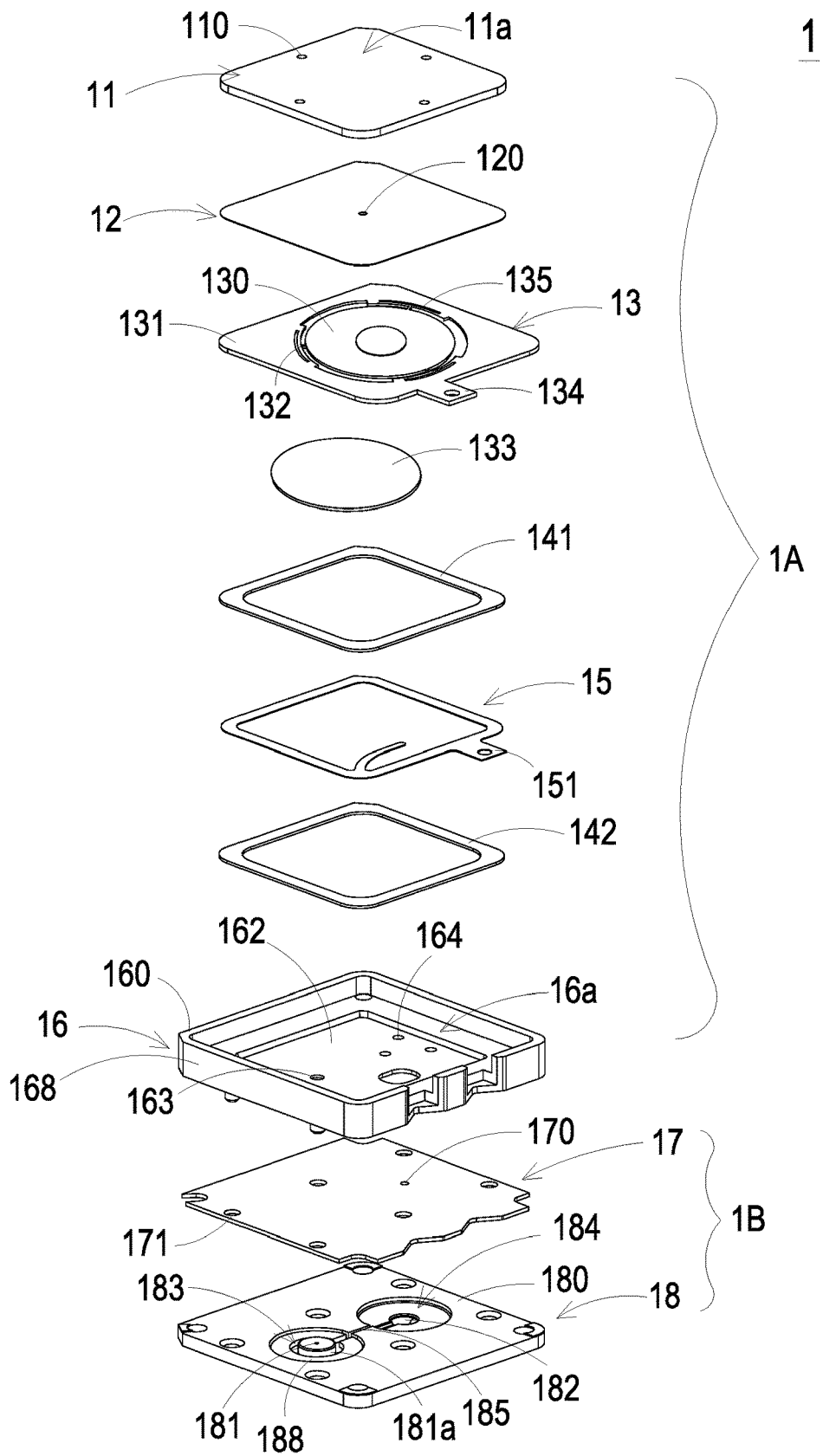
FIG. 1A is a schematic exploded view illustrating a miniature fluid control device according to an embodiment of the present disclosure and taken along a first viewpoint.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Please refer to FIGS. 1A, 1B, 2A, 2B and 4. The present discourse provides a miniature fluid control device 1 including at least one gas inlet plate 11, at least one resonance plate 12, at least one piezoelectric actuator 13, at least one inlet 110, at least one convergence channel 112, at least one convergence chamber 111, at least one central aperture 120, at least one suspension plate 130, at least one first surface 130b, at least one second surface 130a, at least one outer frame 131, at least one assembling surface 131a, at least one bottom surface 131b, at least one bracket 132, at least one piezoelectric element 133, at least one chamber gap g, at least one first chamber 121 and at least one vacant space 135. The number of the gas inlet plate 11, the resonance plate 12, the piezoelectric actuator 13, the inlet 110, the convergence channel 112, the convergence chamber 111, the central aperture 120, the suspension plate 130, the first surface 130b, the second surface 130a, the outer frame 131, the assembling surface 131a, the bottom surface 131b, the bracket 132, the piezoelectric element 133, the chamber gap g, the first chamber 121 and the vacant space 135 is exemplified by one for each in the following embodiments but not limited thereto. It is noted that each of the gas inlet plate 11, the resonance plate 12, the piezoelectric actuator 13, the inlet 110, the convergence channel 112, the convergence chamber 111, the central aperture 120, the suspension plate 130, the first surface 130b, the second surface 130a, the outer frame 131, the assembling surface 131a, the bottom surface 131b, the bracket 132, the piezoelectric element 133, the chamber gap g, the first chamber 121 and the vacant space 135 can also be provided in plural numbers.

The present disclosure provides a miniature fluid control device 1. The miniature fluid control device 1 may be used in many sectors such as pharmaceutical industries, energy industries, computer techniques or printing industries for transporting gases, but not limited thereto. Please refer to FIGS. 1A, 1B, 2A, 2B and 7A to 7D. The miniature fluid control device 1 includes a miniature transportation device 1A and a miniature valve device 1B. In this embodiment, the miniature transportation device 1A includes a gas inlet plate 11, a resonance plate 12, a piezoelectric actuator 13, a first insulation plate 141, a conducting plate 15, a second insulation plate 142 and a gas collecting plate 16. The piezoelectric actuator 13 is disposed spatially corresponding to the resonance plate 12. The gas inlet plate 11, the resonance plate 12, the piezoelectric actuator 13, the first insulation plate 141, the conducting plate 15, the second insulation plate 142 and the gas collecting plate 16 are stacked on each other sequentially. The piezoelectric actuator 13 includes a suspension plate 130, an outer frame 131, at least one bracket 132 and a piezoelectric element 133. In this embodiment, the miniature valve device 1B includes a valve film 17 and a gas outlet plate 18. The gas collecting plate 16, the valve film 17 and the gas outlet plate 18 are stacked on each other sequentially, but not limited thereto. As shown in FIG. 1A, the gas collecting plate 16 may be a single plate structure, or in this embodiment, may be a frame structure having a bottom plate with sidewalls 168 protruding from the edges thereof. The aspect ratio of the gas collecting plate 16 is in the range between 0.53 and 1.88. The bottom plate and the sidewalls 168 of the gas collecting plate 16 collaboratively define an accommodation space 16a, which is used for accommodating the piezoelectric actuator 13 therein.

Figure 1B:
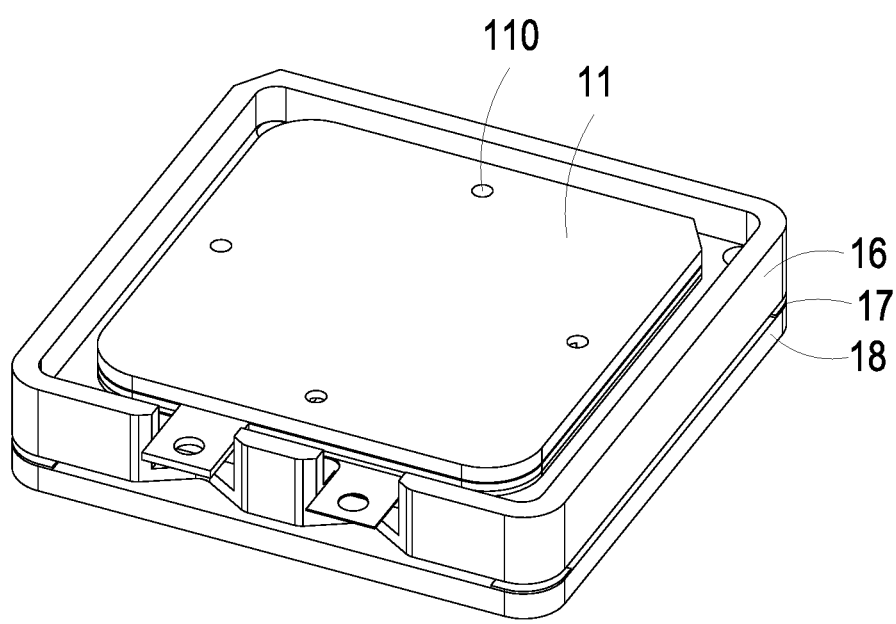
FIG. 1B is a schematic assembled view illustrating the miniature fluid control device of FIG. 1A.
Figure 2A:
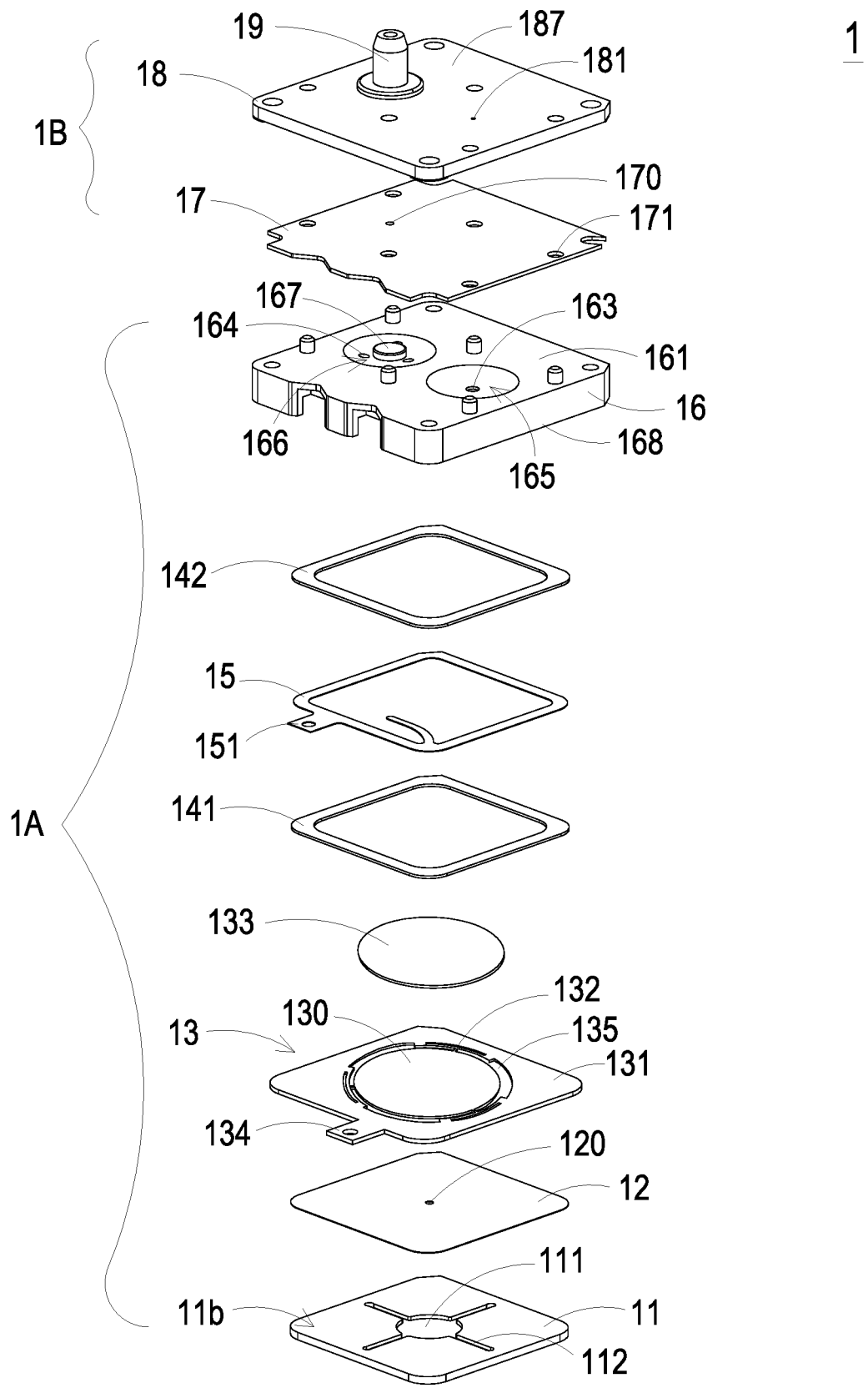
FIG. 2A is a schematic exploded view illustrating the miniature fluid control device according to the embodiment of the present disclosure and taken along a second viewpoint.
Figure 2B:
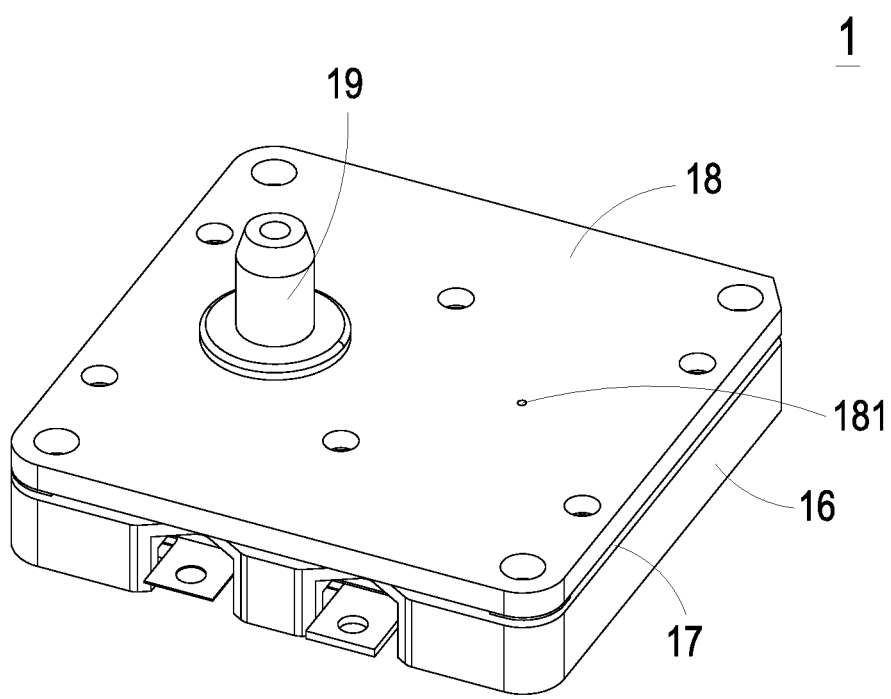
FIG. 2B is a schematic assembled view illustrating the miniature fluid control device of FIG. 2A.
Figure 7A:
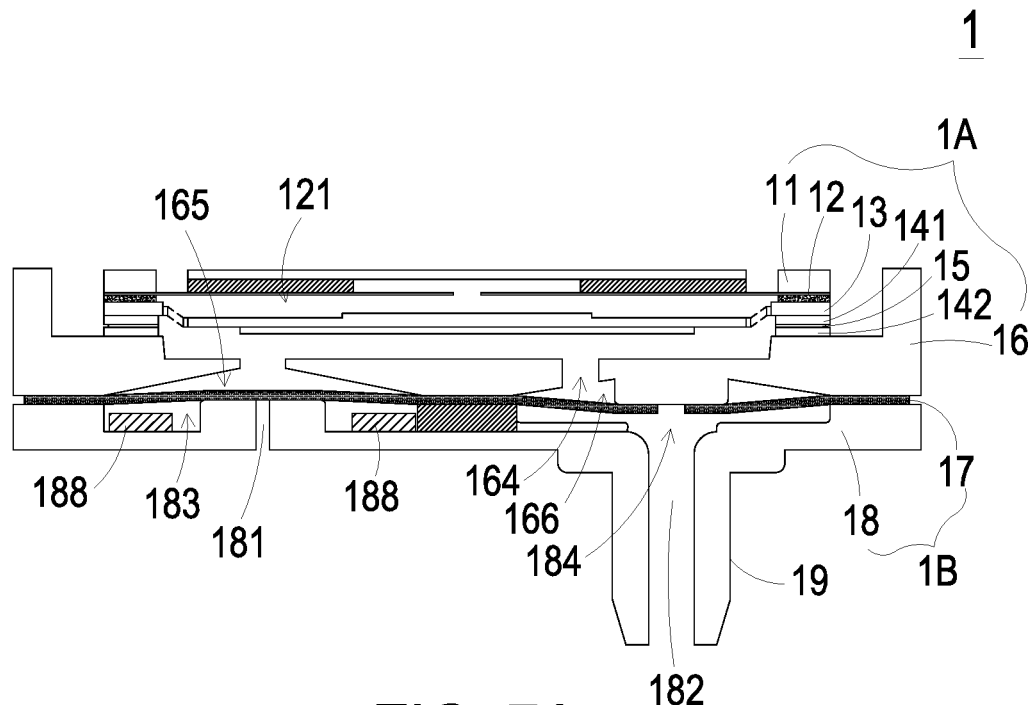
FIGS. 7A to 7D schematically illustrate the miniature fluid control device of FIG. 1A performing the pressurizing operation.
Figure 7B:
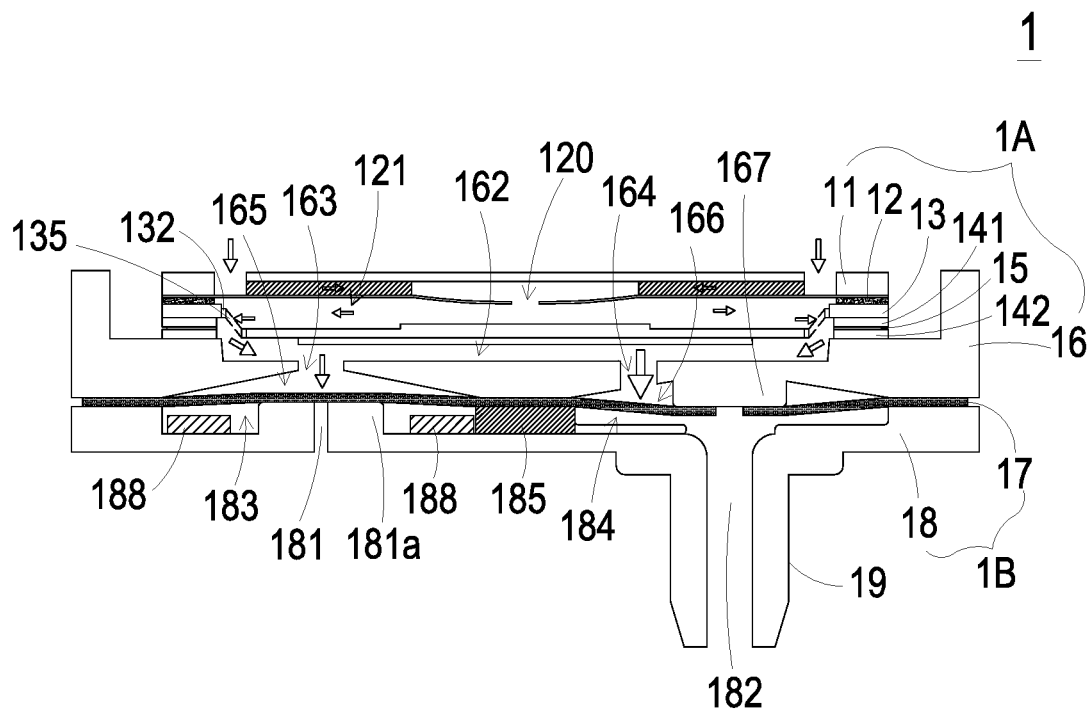

Referring to FIGS. 1B and 7A to 7B, there is shown the miniature fluid control device 1 in an assembled state. FIG. 1 is taken from the front side, and FIGS. 7A and 7B are taken on a cross-sectional. As shown in FIGS. 1B, 7A and 7B, the miniature transportation device 1A is spatially corresponding to and assembled with the miniature valve device 1B. Meanwhile, the valve film 17 and the gas outlet plate 18 of the miniature valve device 1B are sequentially stacked and disposed under the gas collecting plate 16 of the miniature transportation device 1A. Referring to FIG. 2B, there is shown the miniature fluid control device in the assembled state, taken from the rear side. As shown in FIG. 2B, the gas outlet plate 18 has a pressure-releasing perforation 181 and an outlet structure 19. The outlet structure 19 is adapted to be in fluid communication with an inner space of a target equipment (not shown), and the pressure-releasing perforation 181 is adapted to discharge the gas inside the miniature valve device 1B for pressure relief. After the miniature transportation device 1A and the miniature valve device 1B are assembled, gas is introduced through at least one inlet 110 of the gas inlet plate 11 into the miniature transportation device 1A, and the gas is driven by the operation of the piezoelectric actuator 13 to flow through a plurality of pressure chambers (not shown) and be transferred continuously in a transportation direction. As a result, the gas flows in a one-way direction inside the miniature valve device 1B, and accumulates pressure in the target equipment (not shown), which is connected with the outlet structure 19 of the miniature valve device 1B. When it is needed to release the gas pressure in the target equipment, the quantity of the gas transferred from the miniature transportation device 1A to the miniature valve device 1B is adjusted to make the gas discharged through the pressure-releasing perforation 181 of the gas outlet plate 18. Hence, the gas-releasing operation is performed.

Please refer to FIGS. 1A and 2A again. The gas inlet plate 11 of the miniature transportation device 1A includes a first surface 11b, a second surface 11a and at least one inlet 110. In the embodiment, the number of the inlet 110 is exemplified by but not limited thereto four inlets 110. The inlets 110 run through the first surface 11b and the second surface 11a of the gas inlet plate 11. In response to the action of the atmospheric pressure, the gas is introduced through the inlets 110 into the miniature transportation device 1A. As shown in FIG. 2A, at least one convergence channel 112 are formed on the first surface 11b of the gas inlet plate 11, and is opposing to and in fluid communication with the at least one inlet 110 formed on the second surface 11a. In the embodiment, the number of the convergence channel 112 is corresponding to the number of the inlet 110 and is exemplified by four, but not limited thereto. A convergence chamber 111 is disposed on the intersection of the convergence channels 112 and is in fluid communication with the convergence channels 112. Consequently, the gas entered from the inlets 110 to the convergence channels 112 can be guided and converged to the convergence chamber 111 for further transportation. In this embodiment, the at least one inlet 110, the at least one convergence channel 112 and the convergence chamber 111 of the gas inlet plate 11 are integrally formed from a single structure, and the convergence chamber 111 is used for temporarily storing the gas converged thereto. In some embodiments, the gas inlet plate 11 is made of stainless steel, but not limited thereto. The thickness of the gas inlet plate 11 is in the range between 0.4 mm and 0.6 mm, preferably 0.5 mm, but not limited thereto. In some embodiments, the depth of the convergence chamber 111 is equal to the depth of the at least one convergence channel 112 and is in the range between 0.2 mm and 0.3 mm, but not limited thereto. The resonance plate 12 is made of a flexible material, but not limited thereto. The resonance plate 12 includes a movable portion 12a, a fixed portion 12b and a central aperture 120. The central aperture 120 is spatially corresponding to the convergence chamber 111 on the first surface 11b of the gas inlet plate 11 for allowing the gas to flow therethrough. In some other embodiments, the resonance plate 12 is made of copper, but not limited thereto. The thickness of the resonance plate 12 is in the range between 0.03 mm and 0.08 mm, preferably 0.05 mm, but is not limited thereto.

Figure 3A:
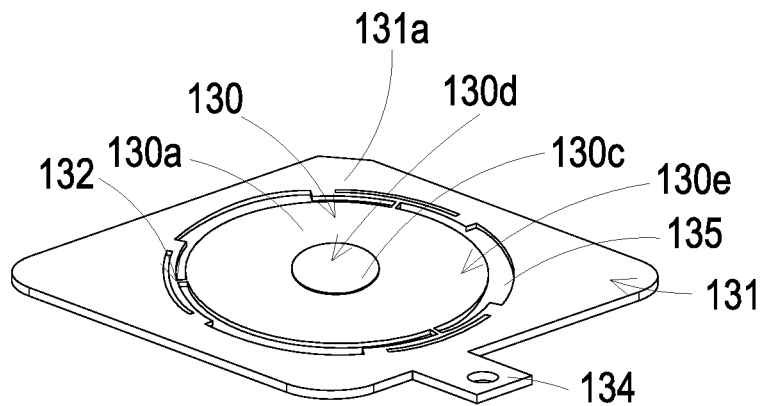
FIG. 3A is a schematic perspective view illustrating the piezoelectric actuator of the miniature fluid control device of FIG. 1A and taken along the front side.
Figure 3B:
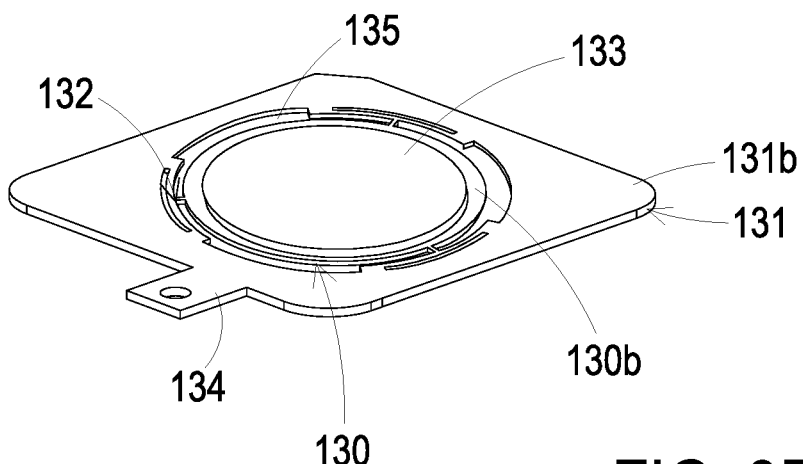
FIG. 3B is a schematic perspective view illustrating the piezoelectric actuator of the miniature fluid control device of FIG. 1A and taken along the rear side.
Figure 3C:
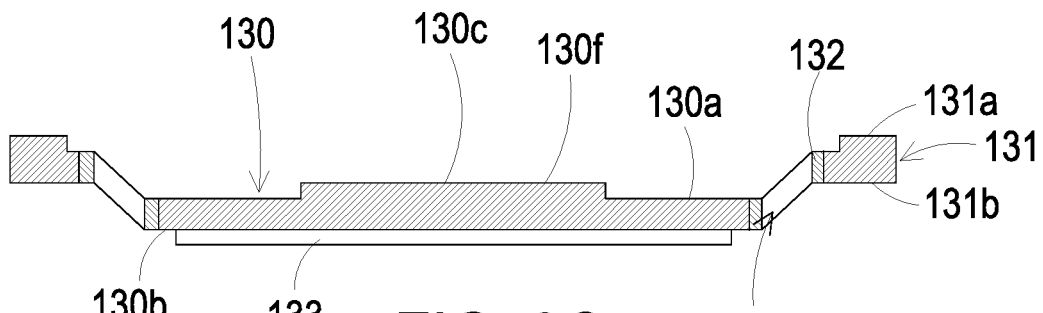
FIG. 3C is a schematic cross-sectional view illustrating the piezoelectric actuator of the miniature fluid control device of FIG. 1A.

Please refer to FIGS. 3A to 3C. The piezoelectric actuator 13 includes the suspension plate 130, the outer frame 131, the at least one bracket 132 and the piezoelectric element 133. The suspension plate 130 includes a first surface 130b and a second surface 130a. The piezoelectric element 133 is attached on the first surface 130b of the suspension plate 130. The piezoelectric element 133 deforms when a voltage is applied. The voltage is applied to the piezoelectric element 133 so as to drive the suspension plate 130 to bend and vibrate. The suspension plate 130 is circular shape and includes a central portion 130d and a peripheral portion 130e. When the voltage is applied to the piezoelectric element 133, both the central portion 130d and the peripheral portion 130e of the suspension plate 130 vibrate and bend. The at least one bracket 132 is connected between the suspension plate 130 and the outer frame 131, while two ends of the bracket 132 are connected with the outer frame 131 and the suspension plate 130, respectively, so as to provide elastic support for the suspension plate 130. At least one vacant space 135 is formed among the at least one bracket 132, the suspension plate 130 and the outer frame 131 for allowing the gas to go through. The outer frame 131 is disposed around the periphery of the suspension plate 130, and a conducting pin 134 is protruding outwardly from the outer frame 131 for an electrical connection, but not limited thereto. Moreover, the outer frame 131 includes an assembling surface 131a and a bottom surface 131b, and the resonance plate 12 is disposed on the assembling surface 131a.

As mentioned above, the suspension plate 130 has a concave profile. In this embodiment, the second surface 130a of the suspension plate 130 and the assembling surface 131a of the outer frame 131 are non-coplanar structure. The second surface 130a of the suspension plate 130 is lower than the assembling surface 131a of the outer frame 131. The first surface 130b of the suspension plate 130 is lower than the bottom surface 131b of the outer frame 131. More specifically, the distance between the second surface 130a of the suspension plate 130 and the resonance plate 12 is greater than the distance between the assembling surface 131a of the outer frame 131 and the resonance plate 12, and the distance between the first surface 130b of the suspension plate 130 and the resonance plate 12 is greater than the distance between the bottom surface 131b of the outer frame 131 and the resonance plate 12, thereby forming a dish-like structure with recess in center. Furthermore, a chamber gap g is kept between the second surface 130a of the suspension plate 130 and the resonance plate 12, and can be adjusted by the at least one bracket 132 formed between the circular suspension plate 130 and the outer frame 131.

Figure 4:
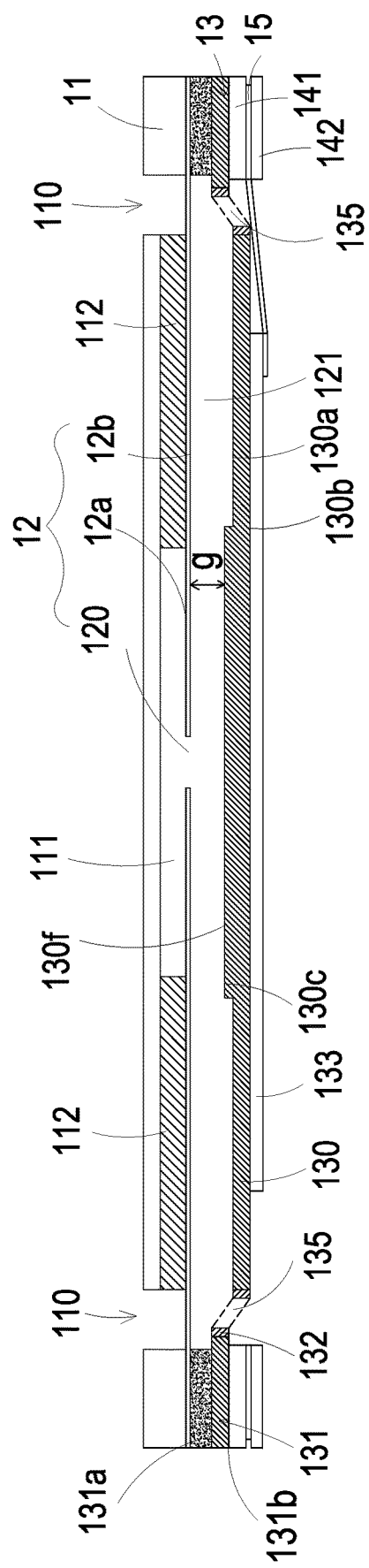
FIG. 4 is a schematic cross-sectional view illustrating the miniature transportation device according to an embodiment of the present disclosure.

In this embodiment, the suspension plate 130 further includes a bulge 130c formed on the second surface 130a of the suspension plate 130, and thus a chamber gap g is kept between a top surface 130f of the bulge 130c and the resonance plate 12. The bulge 130c can be but not limited to a circular convex structure. The height of the bulge 130c is in the range between 0.02 mm and 0.08 mm, preferably 0.03 mm, and the diameter of the bulge 130c is 0.4 to 0.5 times the diameter of the suspension plate 130, but not limited thereto. As shown in FIGS. 3A and 3C, the top surface 130f of the bulge 130c of the suspension plate 130 and the assembling surface 131a of the outer frame 131 are non-coplanar. In this embodiment, the top surface 130f of the bulge 130c of the suspension plate 130 is lower than the assembling surface 131a of the outer frame 131, that is, the distance between the top surface 130f of the bulge 130c of the suspension plate 130 and the resonance plate 12 is greater than the distance between the assembling surface 131a of the outer frame 131 and the resonance plate 12, as shown in FIG. 4. The chamber gap g is formed between the top surface 130f and the resonance plate 12 and can be adjusted by the at least one bracket 132. Since the distance between the suspension plate 130 and the resonance plate 12 will influence the transportation effect of the miniature fluid control device 1, it is very important to maintain the chamber gap g for providing a stable transportation efficiency of the piezoelectric actuator 13. The circular suspension plate 130 of the piezoelectric actuator 13 is processed by the stamping method, so that the suspension plate 130 can be disposed further away from the resonance plate 12. Consequently, the space between the suspension plate 130 of the piezoelectric actuator 13 and the resonance plate 12 is adjustable due to the stamping method, by which the adjustable chamber gap g is realized. That is, the design of the chamber gap g is improved by processing the suspension plate 130 of the piezoelectric actuator 13 to be disposed further away from the resonance plate 12. The desired chamber gap g can be satisfied by simply adjusting the distance between the suspension plate 130 and the resonance plate 12, as described above. It simplifies the structural design regarding the adjustment of the chamber gap g, and it also achieves the advantages of simplifying the process and shortening the processing time. Referring to FIGS. 3B and 3C, the piezoelectric element 133 is attached on the first surface 130b of the suspension plate 130. In this embodiment, the suspension plate 130, the at least bracket 132 and the outer frame 131 are integrally formed by processing a metal plate, for example being made of as a stainless-steel plate, but not limited thereto. In some embodiments, the diameter of the suspension plate 130 is in the range between 4 mm and 8.5 mm, preferably 8 mm, but not limited thereto. The thickness of the outer frame 131 is in the range between 0.2 mm and 0.4 mm, preferably 0.3 mm, but not limited thereto.

In some embodiments, the piezoelectric element 133 is circular shape, the thickness thereof is in the range between 0.05 mm and 0.3 mm, preferably 0.10 mm, and the area thereof is not greater than the area of the suspension plate 130 (i.e., the piezoelectric element 133 has a diameter smaller than that of the suspension plate 130).

Please refer to FIGS. 1A and 2A again. The miniature transportation device 1A further includes the first insulation plate 141, the conducting plate 15 and the second insulation plate 142. The first insulation plate 141, the conducting plate 15 and the second insulation plate 142 are stacked on each other sequentially and located under the piezoelectric actuator 13. The profiles of the first insulation plate 141, the conducting plate 15 and the second insulation plate 142 substantially match the profile of the outer frame 131 of the piezoelectric actuator 13. In some embodiments, the first insulation plate 141 and the second insulation plate 142 are made of an insulating material, for example as a plastic material, for providing insulating efficacy. In some other embodiment, the conducting plate 15 is made of an electrically conductive material, for example a metallic material, for providing electrically conducting efficacy. In this embodiment, the conducting plate 15 has a conducting pin 151 for an electrical connection.

Please refer to FIG. 4. While the gas inlet plate 11, the resonance plate 12 and the piezoelectric actuator 13 are stacked on each other sequentially, a chamber is defined by the central aperture 120 of the resonance plate 12 and the gas inlet plate 11 collaboratively for converging the gas. Moreover, a first chamber 121 is defined by the resonance plate 12 and the piezoelectric actuator 13 collaboratively for temporarily storing the gas. Meanwhile, the first chamber 121 is in fluid communication with the chamber at the convergence chamber 111 on the first surface 11b of the gas inlet plate 11 through the central aperture 120 of the resonance plate 12. Meanwhile, the peripheral regions of the first chamber 121 are in fluid communication with the miniature valve device 1B under the gas collecting plate 16 through the vacant space 135 of the piezoelectric actuator 13 (as shown in FIG. 7A).

Figure 5A:
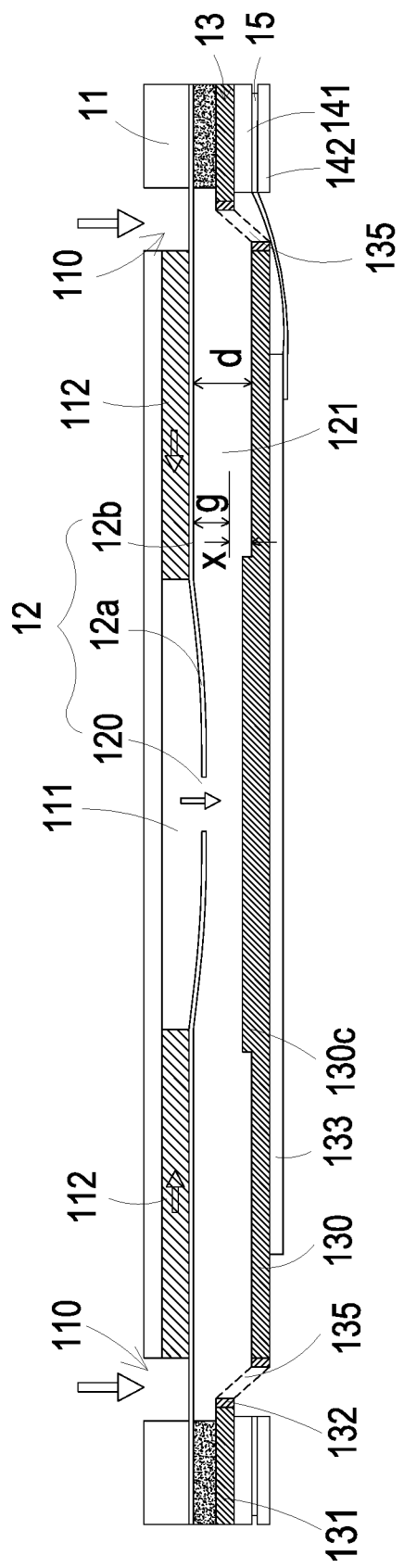
FIGS. 5A to 5C schematically illustrate the portion actions of the miniature transportation device of FIG. 4.
Figure 5B:
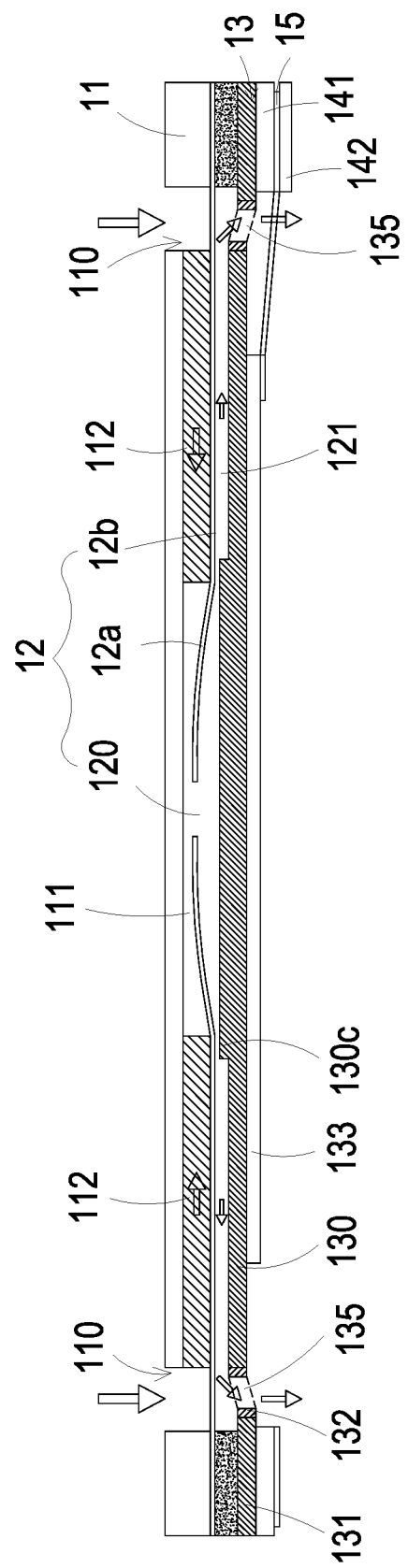
Figure 5C:
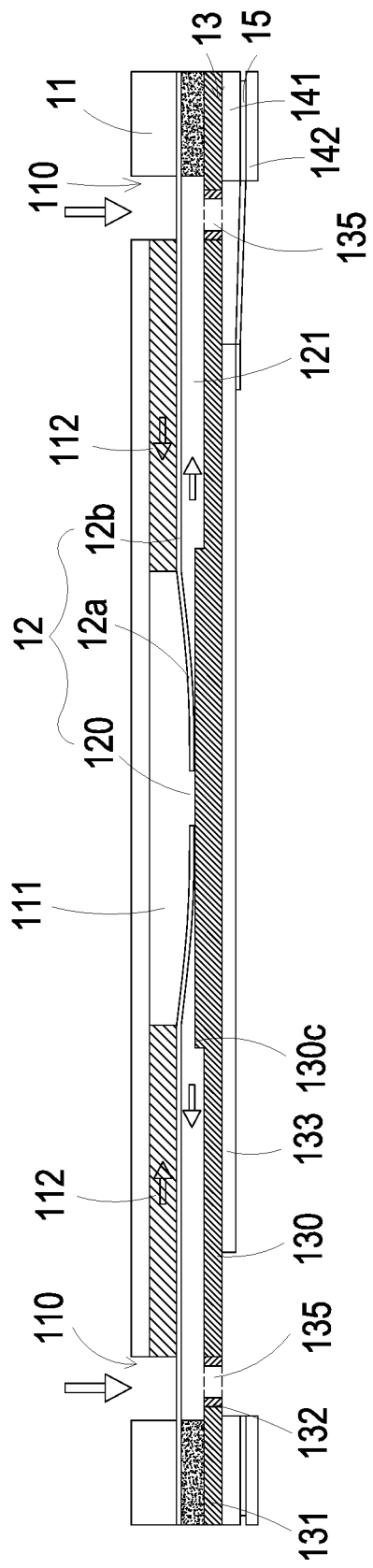

Please refer to FIGS. 5A to 5C. When the miniature transportation device 1A of the miniature fluid control device 1 is enabled, the piezoelectric actuator 13 is actuated in response to an applied voltage. Consequently, the piezoelectric actuator 13 vibrates along a vertical direction in a reciprocating manner, while the at least one bracket 132 is served as the fulcrums. As shown in FIG. 5A, the piezoelectric actuator 13 vibrates downwardly in response to the applied voltage. Since the resonance plate 12 is light and thin, when the piezoelectric actuator 13 vibrates, the resonance plate 12 vibrates along a vertical direction in a reciprocating manner in resonance with the vibration of the suspension plate 130. More specifically, the movable portion 12a of the resonance plate 12 which is spatially corresponding to the convergence chamber 111 of the gas inlet plate 11 bends and vibrates in resonance with the vibration of the suspension plate 130. Therefore, when the piezoelectric actuator 13 vibrates downwardly, the movable portion 12a of the resonance plate 12 bends and vibrates downwardly owing to the introduction and pushing of the fluid and the vibration of the piezoelectric actuator 13. As a result, the gas is fed into the at least one inlet 110 of the gas inlet plate 11. Then, the gas is converged through the at least one convergence channel 112 to the convergence chamber 111 of the gas inlet plate 11, and transferred downwardly to the first chamber 121 through the central aperture 120 of the resonance plate 12, which is relative to the convergence chamber 111. As the piezoelectric actuator 13 is enabled, the resonance of the resonance plate 12 occurs. Consequently, the resonance plate 12 vibrates along the vertical direction in the reciprocating manner. Referring to FIG. 5B, when the suspension plate 130 vibrates upwardly, the movable portion 12a of the resonance plate 12 is contacted with the bulge 130c of the suspension plate 130 of the piezoelectric actuator 13. Because the space between the periphery of the bulge 130c of the suspension plate 130 and the fixed portion 12b of the resonance plate 12 is compressed, the volume of the first chamber 121 is shrunken. Owing to the deformation of the resonance plate 12 described above, a middle communication space of the first chamber 121 is closed, and the volume of the first chamber 121 is compressed. Under this circumstance, the pressure gradient occurs to push the gas in the first chamber 121 toward peripheral regions of the first chamber 121, and flowing downwardly through the vacant space 135 of the piezoelectric actuator 13. As shown in FIG. 5C, the resonance plate 12 moves upwardly, which is cause by the resonance of upward motion of the piezoelectric actuator 13, and the movable portion 12a of the resonance plate 12 reaches the upward position. Under this circumstance, the gas in the convergence chamber 111 is transferred through the central aperture 120 of the resonance plate 12 to the first chamber 121, then the gas is transferred downwardly through the vacant space 135 of the piezoelectric actuator 13, and finally the gas is exited from the miniature transportation device 1A. By repeating the operations described above, the gas can be introduced continuously from the inlet 110 and transferred downwardly, and the purpose of transporting the gas is achieved. As described above, when the resonance plate 12 vibrates along a vertical direction in a reciprocating manner, the maximum vertical displacement of the resonance plate 12 can be increased by adjusting the chamber gap g. In other words, by increasing the distance between the suspension plate 130 and the resonance plate 12, which defining the chamber gap g, the amplitude of the resonance of the resonance plate 12 can be increased. In this embodiment, when a difference x between a maximum vibration distance d of the suspension plate 130 and the height of the chamber gap g (i.e., x=g−d) is in the range between 1 um and 5 um, the maximum value of the output pressure of the miniature fluid control device 1 can be 350 mmHg with the operation frequency in the range between 17 K and 20 K and the operation voltage in the range between ±10 V and ±20 V. Consequently, a pressure gradient is generated in the flow channels of the miniature transportation device 1A to facilitate the gas to flow at a high speed. Moreover, since there is an impedance difference between the feeding direction and the exiting direction, the gas can be transmitted from the inlet side to the outlet side. Even if a gas pressure exists at the outlet side, the miniature transportation device 1A still has the capability of pushing the gas to the outlet side while achieving the silent efficacy.

In some embodiments, the vibration frequency of the resonance plate 12 along the vertical direction in the reciprocating manner is identical to the vibration frequency of the piezoelectric actuator 13. That is, the resonance plate 12 and the piezoelectric actuator 13 are synchronously vibrated along the upward direction or the downward direction. It is noted that numerous modifications and alterations of the actions of the resonance plate 12 and the piezoelectric actuator 13 may be made while retaining the teachings of the disclosure.

Please refer to FIGS. 1A, 2A, 6A and 6B. In this embodiment, the miniature valve device 1B includes the valve film 17 and the gas outlet plate 18 which are sequentially stacked, and is operated in cooperation with the gas collecting plate 16 of the miniature transportation device 1A.

In the present embodiment, the gas collecting plate 16 has a surface 160 and a fiducial surface 161 opposite to the surface 160. The surface 160 is concaved to define a gas-collecting chamber 162, so that the piezoelectric actuator 13 can be disposed therein. The gas that is transferred downwardly by the miniature transportation device 1A is temporarily accumulated in the gas-collecting chamber 162. The gas collecting plate 16 has a plurality of perforations, including a first perforation 163 and a second perforation 164. A first end of the first perforation 163 and a first end of the second perforation 164 are in fluid communication with the gas-collecting chamber 162. A second end of the first perforation 163 and a second end of the second perforation 164 are in fluid communication with a first pressure-releasing chamber 165 and a first outlet chamber 166, respectively, wherein the first pressure-releasing chamber 165 and the first outlet chamber 166 are concavely formed on the fiducial surface 161 of the gas collecting plate 16. Moreover, a raised structure 167 is disposed in the first outlet chamber 166 and can be for example but not limited to a cylindrical structure. The height of the raised structure 167 is higher than the height of the fiducial surface 161 and is in the range between 0.3 mm and 0.55 mm, preferably 0.4 mm.

The gas outlet plate 18 includes the pressure-releasing perforation 181, an outlet perforation 182, a fiducial surface 180 and a second surface 187. The pressure-releasing perforation 181 and the outlet perforation 182 run through the fiducial surface 180 and the second surface 187 of the gas outlet plate 18. The fiducial surface 180 is concaved to define a second pressure-releasing chamber 183 and a second outlet chamber 184, wherein the pressure-releasing perforation 181 is disposed in the center of the second pressure-releasing chamber 183. The second pressure-releasing chamber 183 and the second outlet chamber 184 are in fluid communication with each other by a communication channel 185 for allowing the gas to go through. Meanwhile, a first end of the outlet perforation 182 is in fluid communication with the second outlet chamber 184, and a second end of the outlet perforation 182 is in fluid communication with the outlet structure 19. The outlet structure 19 may be connected with the target equipment (not shown), such as a press but not limited thereto.

The valve film 17 has a valve opening 170 and a plurality of positioning openings 171. The thickness of the valve film 17 is in the range between 0.1 mm and 0.3 mm, preferably 0.2 mm.

After the valve film 17, the gas collecting plate 16 and the gas outlet plate 18 are combined together, the pressure-releasing perforation 181 is spatially corresponding to the first perforation 163, the second pressure-releasing chamber 183 is spatially corresponding to the first pressure-releasing chamber 165, and the second outlet chamber 184 is spatially corresponding to the first outlet chamber 166. Meanwhile, the valve film 17 is disposed between the gas collecting plate 16 and the gas outlet plate 18, and thus blocks the fluid communication between the first pressure-releasing chamber 165 and the second pressure-releasing chamber 183. The valve opening 170 is disposed between the second perforation 164 and the outlet perforation 182, and is spatially corresponding to the raised structure 167 within the first outlet chamber 166 of the gas collecting plate 16. Due to such arrangement of the single valve opening 170, the gas flows unidirectionally in the miniature valve device 1B when there is a pressure difference.

A raised structure 181a can be disposed around the first end of the pressure-releasing perforation 181. The raised structure 181a can be for example but not limited to a cylindrical structure. The height of the raised structure 181a is in the range between 0.3 mm and 0.55 mm, preferably 0.4 mm. The raised structure 181a is improved to have an increased height and raised from the fiducial surface 180, so that the valve film 17 can abuts and seals the pressure-releasing perforation 181 rapidly, and a pre-force is provided to achieve a good sealing effect. The gas outlet plate 18 further includes at least one position-limiting structure 188, and the height of the position-limiting structure 188 is 0.32 mm. In the present embodiment, the position-limiting structure 188 is disposed in the second pressure-releasing chamber 183. The position-limiting structure 188 may be, but not limited to a ring-shaped structure. While the miniature valve device 1B is performing the pressurizing operation, the position-limiting structure 188 can assist in supporting the valve film 17 and avoid collapse of the valve film 17. Consequently, the valve film 17 can be opened or closed more rapidly.

Figure 6A:
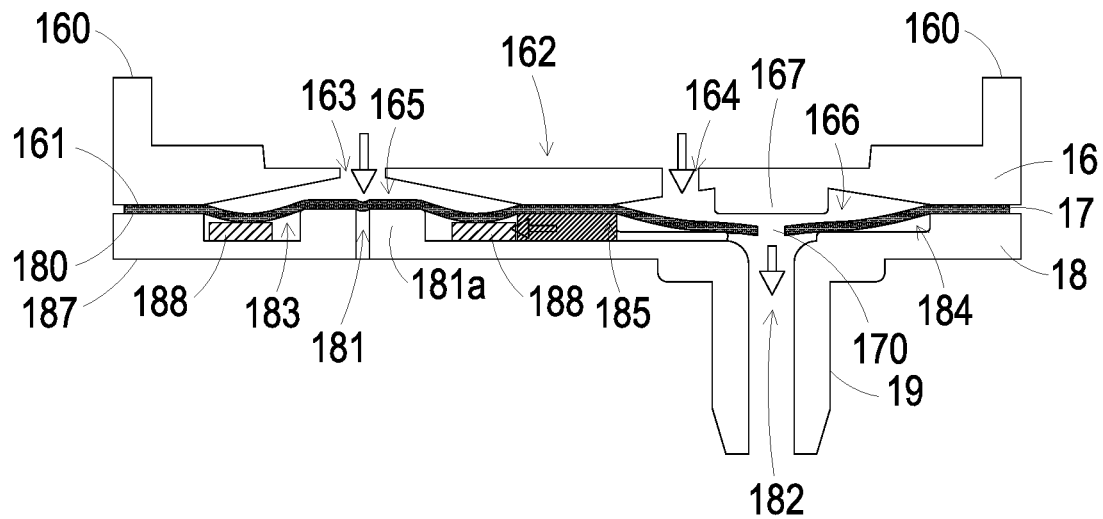
FIG. 6A schematically illustrates the gas collecting plate and the miniature valve device of the miniature fluid control device of FIG. 1A performing a pressurizing operation.

Hereinafter, the pressurizing operation of the miniature valve device 1B will be illustrated with reference to FIG. 6A. The pressurizing operation of the miniature valve device 1B is activated in response to a force provided by the gas transferred downwardly from the miniature transportation device 1A to the miniature valve device 1B, or is activated when the ambient air pressure is greater than the inner pressure of the target equipment (not shown) connected to the outlet structure 19. When the pressurizing operation of the miniature valve device 1B is activated, the gas in the gas-collecting chamber 162 of the gas collecting plate 16 of the miniature transportation device 1A is transferred downwardly to the first pressure-releasing chamber 165 and the first outlet chamber 166 through the first perforation 163 and the second perforation 164, respectively. In response to a force of the downwardly moving gas, the flexible valve film 17 is subjected to a downward curvy deformation. Consequently, the volume of the first pressure-releasing chamber 165 is expanded, and a part of the valve film 17 spatially corresponding to the first perforation 163 is abutting against the first end of the pressure-releasing perforation 181 of the gas outlet plate 18 to make the pressure-releasing perforation 181 closed. Thus, the gas within the second pressure-releasing chamber 183 is not leaked out from the pressure-releasing perforation 181. The gas outlet plate 18 may have the raised structure 181a beside the first end of the pressure-releasing perforation 181. Due to the arrangement of the raised structure 181a, the valve film 17 abuts against the pressure-releasing perforation 181 more rapidly and closes the pressure-releasing perforation 181 more effectively. Moreover, the raised structure 181a provides a pre-force to achieve a good sealing effect. Moreover, the position-limiting structure 188 is spaced apart from and is arranged around the pressure-releasing perforation 181 to assist in supporting the valve film 17 and avoid collapse of the valve film 17. On the other hand, when the gas is transferred downwardly through the second perforation 164 to the first outlet chamber 166, a part of the valve film 17 spatially corresponding to the first outlet chamber 166 is also subjected to the downward curvy deformation in response to the force of the downwardly moving gas. Consequently, the valve opening 170 of the valve film 17 is opened by moving downwardly. Under this circumstance, the gas is transferred from the first outlet chamber 166 to the second outlet chamber 184 through the valve opening 170. Then, the gas is transferred through the outlet perforation 182 to the outlet structure 19 and then transferred to the target equipment which is in fluid communication with the outlet structure 19. Consequently, the pressurizing operation is performed and the target equipment is pressurized.

Figure 6B:
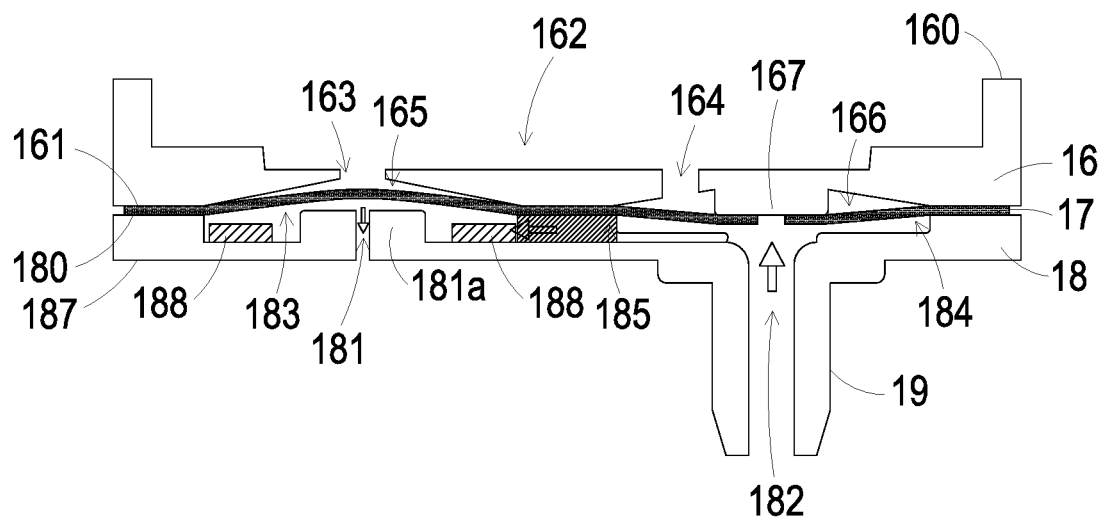
FIG. 6B schematically illustrates the gas collecting plate and the miniature valve device of the miniature fluid control device of FIG. 1A performing a pressure-releasing operation.

Hereinafter, the pressure-releasing operation of the miniature valve device 1B will be illustrated with reference to FIG. 6B. To activate the pressure-releasing operation, the user can adjust the gas transportation amount of the miniature transportation device 1A to make the gas no longer transferred to the gas-collecting chamber 162. Alternatively, in case that the inner pressure of the target equipment (not shown) which is fluid in communication with the outlet structure 19 is greater than the ambient air pressure, the pressure-releasing operation is also activated. When the pressure-releasing operation of the miniature valve device 1B is activated, the gas is transferred through the outlet perforation 182 which is penetrating the outlet structure 19 to the second outlet chamber 184. Consequently, the volume of the second outlet chamber 184 is expanded, and a part of the flexible valve film 17 spatially corresponding to the second outlet chamber 184 is subjected to the upward curvy deformation. In addition, the valve film 17 is in close contact with the gas collecting plate 16. Consequently, the valve opening 170 of the valve film 17 is abutted against and closed by the gas collecting plate 16. Moreover, in the present embodiment, the gas collecting plate 16 has the raised structure 167 spatially corresponding to the first outlet chamber 166. Due to the arrangement of the raised structure 167, the flexible valve film 17 can be bent upwardly to reach an abutting state more rapidly. Moreover, the raised structure 167 can provide a pre-force to achieve a good sealing effect on the closing valve opening 170. In an initial state of the pressure-releasing operation, the valve opening 170 of the valve film 17 is closed since it is closely contacted with and abutting against the raised structure 167. Thus, the gas in the second outlet chamber 184 will not be reversely returned to the first outlet chamber 166, and the efficacy of avoiding gas leakage is enhanced. Meanwhile, the gas in the second outlet chamber 184 flows through the communication channel 185 to the second pressure-releasing chamber 183, and the volume of the second pressure-releasing chamber 183 is expanded. Consequently, the part of the valve film 17 spatially corresponding to the second pressure-releasing chamber 183 is also subjected to the upward curvy deformation and moves away from the pressure-releasing perforation 181. Since the valve film 17 is no longer in contact with the first end of the pressure-releasing perforation 181, the pressure-releasing perforation 181 is opened. Under this circumstance, the gas in the second pressure-releasing chamber 183 is outputted through the pressure-releasing perforation 181, such that the pressure-releasing operation is performed. In the present embodiment, due to the raised structure 181a beside the pressure-releasing perforation 181 or the position-limiting structure 188 disposed within the second pressure-releasing chamber 183, the flexible valve film 17 can be subjected to the upward curvy deformation more rapidly, which facilitates release of the flexible valve film 17 from the state closing the pressure-releasing perforation 181. The pressure-releasing operation in which the gas flows unidirectionally can discharge the gas within inner space of the target equipment (not shown), partially or completely. Under this circumstance, the gas pressure of the target equipment is reduced.

Please refer to FIGS. 1A, 2A, 4, 6A, 6B and 7A to 7D. The miniature fluid control device 1 includes the miniature transportation device 1A and the miniature valve device 1B. As mentioned above, the gas inlet plate 11, the resonance plate 12, the piezoelectric actuator 13, the first insulation plate 141, the conducting plate 15, the second insulation plate 142 and the gas collecting plate 16 of the miniature transportation device 1A are stacked on each other sequentially to be assembled. There is the chamber gap g between the resonance plate 12 and the piezoelectric actuator 13. Moreover, the first chamber 121 is formed between the resonance plate 12 and the piezoelectric actuator 13. The miniature valve device 1B includes the valve film 17 and the gas outlet plate 18, which are stacked below the gas collecting plate 16 of the miniature transportation device 1A sequentially. The gas-collecting chamber 162 is arranged between the gas collecting plate 16 and the piezoelectric actuator 13 of the miniature transportation device 1A. The first pressure-releasing chamber 165 and the first outlet chamber 166 are concavely formed on the fiducial surface 161 of the gas collecting plate 16. The second pressure-releasing chamber 183 and the second outlet chamber 184 are concavely formed on the fiducial surface 180 of the gas outlet plate 18. In this embodiment, the operation frequency of the miniature transportation device 1A is controlled in the range between 27 K and 29.5 K, and the operation voltage of the miniature transportation device 1A is controlled in the range between ±10V and ±16V. Due to the operation parameter and the arrangements of the above-mentioned pressure chambers cooperating with the actuation of the piezoelectric actuator 13, and the vibrations of the resonance plate 12 and the valve film 17, the gas is transferred downwardly in the transportation direction to pressurize.

As shown in FIGS. 4, 5A and 7B, when the piezoelectric actuator 13 of the miniature transportation device 1A vibrates downwardly in response to the applied voltage, the resonance of the resonance plate 12 occurs. Consequently, the resonance plate 12 vibrates along the vertical direction in the reciprocating manner. The resonance plate 12 vibrates downwardly and is contacted with the bulge 130c of the suspension plate 130 of the piezoelectric actuator 13. Due to the deformation of the resonance plate 12, the volume of the chamber spatially corresponding to the convergence chamber 111 of the gas inlet plate 11 is expanded. Under this circumstance, the gas in the ambience is guided into the miniature transportation device 1A from the inlet 110 of the gas inlet plate 11, is converged through the convergence channel 112 to the convergence chamber 111, and then is guided through the central aperture 120 of the resonance plate 12 into the first chamber 121. Meanwhile, the gas in the first chamber 121 is pushed toward peripheral regions of the first chamber 121. Consequently, the gas is transferred downwardly through the vacant space 135 of the piezoelectric actuator 13. Then, the gas is transferred to the gas-collecting chamber 162 between the miniature transportation device 1A and the miniature valve device 1B. After that, the gas is transferred downwardly to the first pressure-releasing chamber 165 and the first outlet chamber 166 through the first perforation 163 and the second perforation 164, which are in fluid communication with the gas-collecting chamber 162.

Figure 7C:
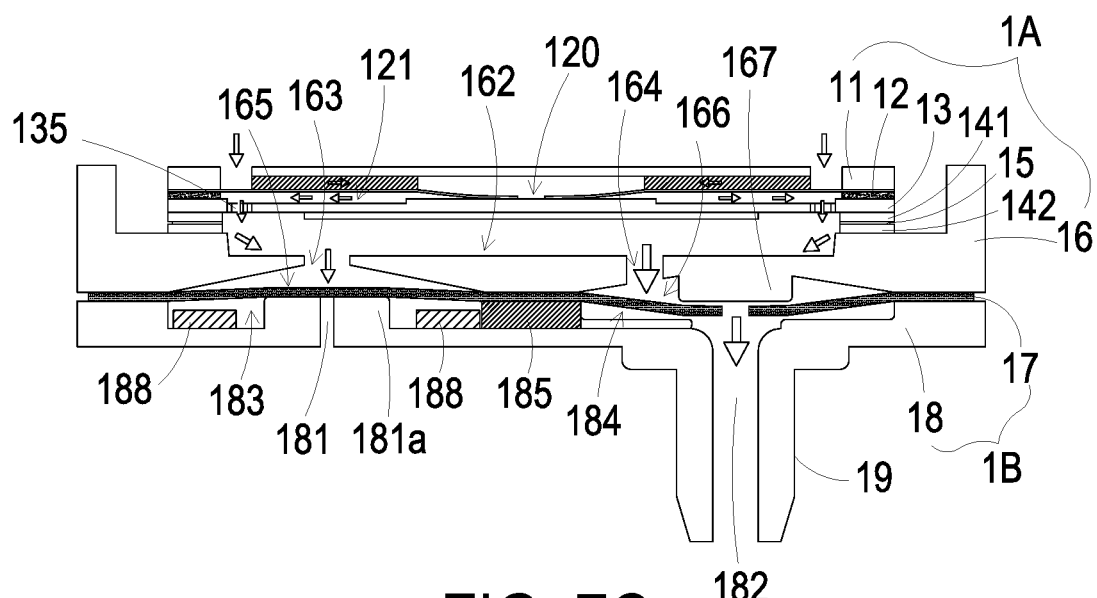
Figure 7D:
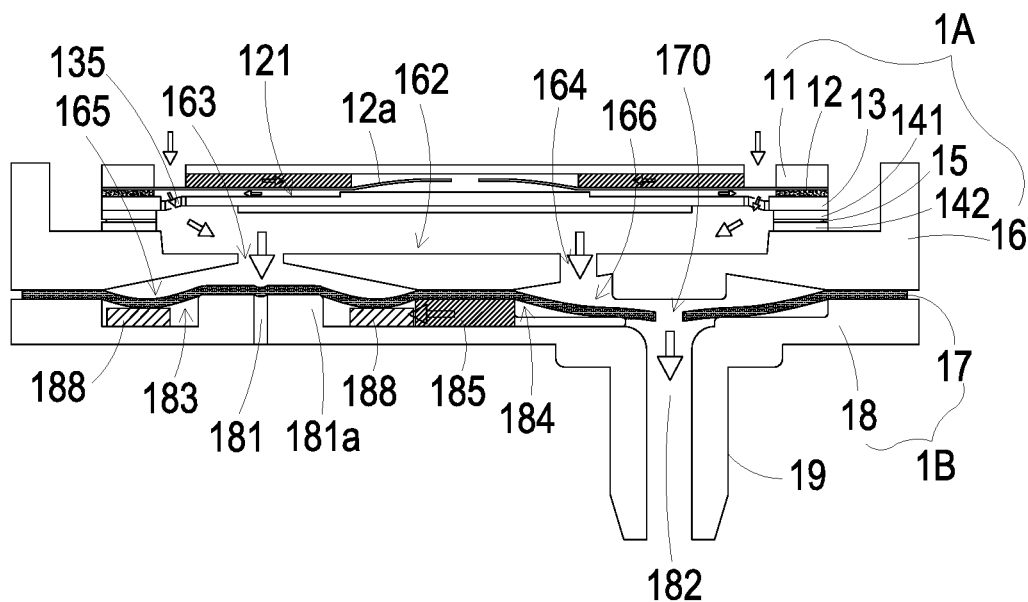

As shown in FIGS. 5B and 7C, when the piezoelectric actuator 13 of the miniature transportation device 1A vibrates upwardly in response to the applied voltage, the movable portion 12a of the resonance plate 12 is contacted with the bulge 130c of the suspension plate 130 of the piezoelectric actuator 13. Because the space between the periphery of the bulge 130c and the fixed portion 12b of the resonance plate 12 is compressed, the volume of the first chamber 121 is shrunken. Owing to the deformation of the resonance plate 12, a middle communication space of the first chamber 121 is closed, and the volume of the first chamber 121 is compressed. Consequently, the gas is continuously pushed toward peripheral regions of the first chamber 121. Moreover, the gas is continuously transferred from the vacant space 135 of the piezoelectric actuator 13 to the gas-collecting chamber 162, the first pressure-releasing chamber 165 and the first outlet chamber 166 of the miniature transportation device 1A. Consequently, the gas pressure in the first pressure-releasing chamber 165 and the gas pressure in the first outlet chamber 166 are gradually increased. In response to the increased gas pressure, the flexible valve film 17 is subjected to the downward curvy deformation. Consequently, the part of the valve film 17 spatially corresponding to the second pressure-releasing chamber 183 is moved downwardly and abutting against the raised structure 181a surrounding the first end of the pressure-releasing perforation 181. Under this circumstance, the pressure-releasing perforation 181 of the gas outlet plate 18 is closed. In the second outlet chamber 184, the valve opening 170 of the valve film 17 spatially corresponding to the outlet perforation 182 is opened by moving downwardly. Then, the gas within the second outlet chamber 184 is transferred downwardly through the outlet perforation 182 to the outlet structure 19 and then transferred to the target equipment (not shown) which is in fluid communication with the outlet structure 19. Consequently, the inner space of the target equipment is pressurized, and the pressurizing operation is performed. Finally, as shown in FIGS. 5C and 7D, the resonance plate 12 vibrates upwardly in resonance with upward motion of the piezoelectric actuator 13, and the movable portion 12a of the resonance plate 12 reaches the upward position. Under this circumstance, the gas in the convergence chamber 111 of the gas inlet plate 11 is transferred through the central aperture 120 of the resonance plate 12 to the first chamber 121, and then the gas is transferred downwardly through the vacant space 135 of the piezoelectric actuator 13 to the gas collecting plate 16. Since the gas is continuously transferred downwardly, the gas pressure in the first pressure-releasing chamber 165 and the gas pressure in the first outlet chamber 166 are further increased. In response to the increased gas pressure, the flexible valve film 17 is further deformed downwardly. Consequently, the part of the valve film 17 abuts against the position-limiting structure 188, which is used for assisting in supporting the valve film 17 and avoiding collapse of the valve film 17. Meanwhile, the valve opening 170 of the valve film 17 is contacted with the outlet perforation 182, and the distance between the valve opening 170 and the raised structure 167 is increased. Consequently, the gas is continuously transferred along the transportation direction to the gas-collecting chamber 162, the second perforation 164, the first outlet chamber 166, the second outlet chamber 184 and the outlet perforation 182, and is continuously transferred to the target equipment which is in fluid communication with the outlet structure 19. This pressurizing operation may be triggered by the pressure difference between the ambient air pressure (e.g., atmospheric pressure) and the inner space of the target equipment, but not limited thereto.

Figure 8:
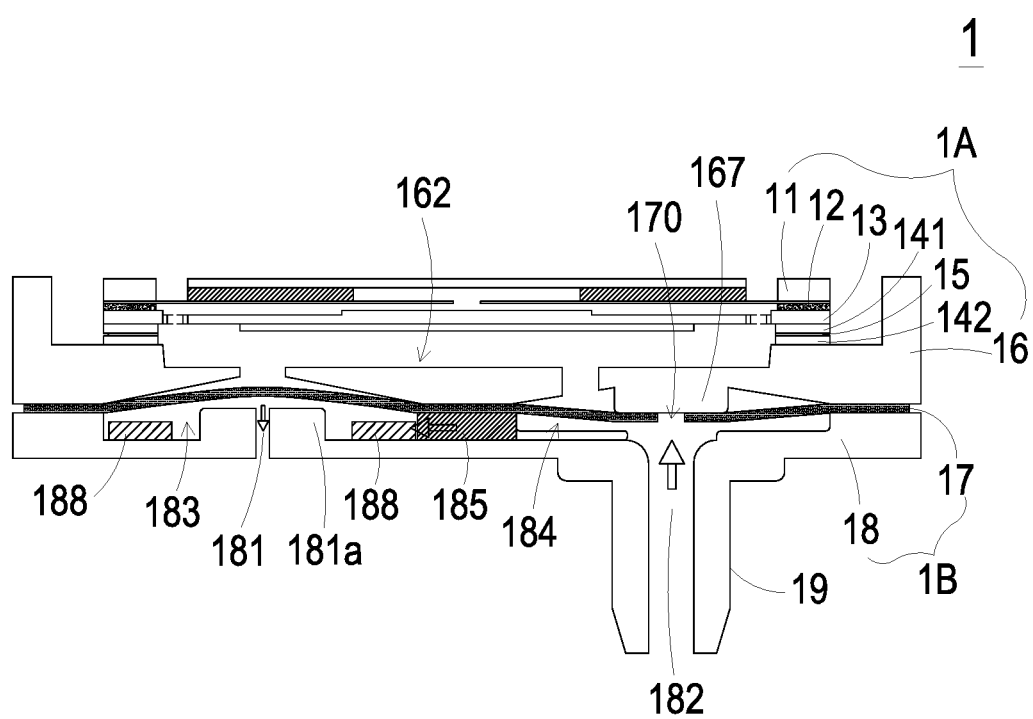
FIG. 8 schematically illustrates the miniature fluid control device of FIG. 1A performing the pressure-releasing operation.

As shown in FIG. 8, when the inner pressure of the target equipment (not shown) connected to the outlet structure 19 is greater than the ambient air pressure, the miniature fluid control device 1 performs the pressure-releasing operation to reduce the inner pressure of the target equipment. As mentioned above, the user may adjust the gas transportation amount of the miniature transportation device 1A to stop the gas from being transferred to the gas-collecting chamber 162. Under this circumstance, the gas is transferred from the outlet structure 19 to the second outlet chamber 184 through the outlet perforation 182 connected with the outlet structure 19. Consequently, the volume of the second outlet chamber 184 is expanded, and the part of the flexible valve film 17 spatially corresponding to the second outlet chamber 184 is bent upwardly to abut against the raised structure 167 with the first outlet chamber 166. Since the valve opening 170 of the valve film 17 is closed by the raised structure 167, the gas in the second outlet chamber 184 will not be reversely returned to the first outlet chamber 166. Moreover, the gas in the second outlet chamber 184 is transferred through the communication channel 185 to the second pressure-releasing chamber 183. In this circumstance, the valve film 17 is supported by the position-limiting structure 188 to be avoided from collapse. Owing to the supporting of the position-limiting structure 188, the valve film 17 is able to move upwardly and leave the raised structure 181a around the end of the pressure-releasing perforation 181 rapidly. Consequently, the pressure-releasing perforation 181 is opened, and the gas is discharged through the pressure-releasing perforation 181. The unidirectional gas transportation implemented in the miniature valve device 1B discharges the gas within inner space of the target equipment (not shown) connected to the outlet structure 19, partially or completely, to decrease the inner pressure of the target equipment. Under this circumstance, the pressure-releasing operation is performed.

To meet the trend of miniaturization, the total thickness of the miniature transportation device 1A and the miniature valve device 1B is in the range between 2 mm and 6 mm. As a result, the miniature fluid control device 1 is portable and suitable to be applied to medical equipment or any other appropriate equipment.

As mentioned above, the suspension plate 130 is circular shape. When the diameter of the suspension plate 130 is reduced to the range between 4 mm and 8.5 mm, which means that the area of the suspension plate 130 is also reduced, the rigidity of the suspension plate 130 is increased. Meanwhile, since the shrunken volume of the interior gas passageway benefits the pushing or pressurizing operation, the output pressure of the miniature fluid control device 1 is improved. On the other hand, the horizontal deformation amount of the suspension plate 130 occurred during the vertical vibration is decreased, so that the suspension plate 130 can keep vibrating along the same vertical direction during the operation without being inclined. Thereby, the collision between the suspension plate 130 and the resonance plate 12 or the other elements during operation can be reduced. Consequently, the generated noise is reduced, and the defect rate is lowered. As mentioned above, by reducing the size of the suspension plate 130 of the piezoelectric actuator 13, the size of the piezoelectric actuator 13 can be reduced, the efficacies of improving the output pressure, reducing the generated noise and lowering the defect rate are achieved.

From the above descriptions, the present disclosure provides the miniature transportation device. Since the shapes of the piezoelectric element and the suspension plate are both circular shape, and the areas of them are close to each other, the kinetic energy loss of the piezoelectric element can be reduced, so that the suspension plate can be driven by the piezoelectric element efficiently. Additionally, by processing the suspension plate by the stamping method, the chamber gap between the suspension plate and the resonance plate is adjusted. Thereby, the volume of the first chamber is kept, and the problem due to the difficulty of the assembling process of the miniature transportation device is avoided. The collision between the suspension plate and the resonance plate during operation can be reduced, the generated noise is reduced, and the transportation efficiency is improved. Consequently, the efficacy of silence is achieved, and the overall volume and thickness of the miniature transportation device are reduced. Therefore, the miniature transportation device is portable and suitable to be applied to medical equipment or any other appropriate equipment. In other words, the miniature transportation device of the present disclosure is industrially valuable.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A miniature transportation device comprising:
    a gas inlet plate comprising at least one inlet, at least one convergence channel and a convergence chamber, wherein the at least one inlet is configured to introduce gas into the miniature transportation device, and a first end of the at least one convergence channel is in fluid communication with the at least one inlet, and a second end of the at least one convergence channel is in communication with the convergence channel, so that the gas fed from the at least one inlet is converged to the convergence chamber;
    a resonance plate comprising a central aperture spatially corresponding to the convergence chamber of the gas inlet plate; and
    a piezoelectric actuator comprising:
        a suspension plate having a diameter in the range between 4 mm and 8.5 mm and comprising a first surface, a second surface and a bulge having a top surface formed on the second surface;
        an outer frame surrounding the periphery of the suspension plate and comprising an assembling surface and a bottom surface, wherein the top surface and the assembling surface are non-coplanar when the miniature transportation device is not actuated;
        at least one bracket connected between the suspension plate and the outer frame to provide elastic support for the suspension plate; and
        a piezoelectric element attached on the first surface of the suspension plate;
        wherein the resonance plate is stacked on the assembling surface of the outer frame, and the gas inlet plate is stacked on the resonance plate, so that the gas inlet plate, the resonance plate and the piezoelectric actuator are stacked on each other sequentially, and a chamber gap is formed between the resonance plate and the piezoelectric actuator to define a first chamber, wherein when the piezoelectric actuator is enabled, the gas is fed through the at least one inlet of the gas inlet plate into the miniature transportation device, converged through the at least one convergence channel to the convergence chamber, transferred through the central aperture of the resonance plate, introduced into the first chamber, and transferred along a transportation direction through at least one vacant space of the piezoelectric actuator to be discharged continuously,
        wherein the chamber gap is adjusted by the at least one bracket formed between the suspension plate and the outer frame.

2. The miniature transportation device according to claim 1, wherein the second surface of the suspension plate and the assembling surface of the outer frame are non-coplanar structure, so that the chamber gap is kept between the second surface of the suspension plate and the resonance plate.

3. The miniature transportation device according to claim 1, wherein the distance between the second surface of the suspension plate and the resonance plate is greater than the distance between the assembling surface of the outer frame and the resonance plate.

4. The miniature transportation device according to claim 3, wherein the distance between the first surface of the suspension plate and the resonance plate is greater than the distance between the bottom surface of the outer frame and the resonance plate.

5. The miniature transportation device according to claim 1, wherein the outer frame, the at least one bracket and the suspension plate collaboratively form a dish-like structure.

6. The miniature transportation device according to claim 1, wherein the distance between the top surface of the bulge of the suspension plate and the resonance plate is greater than the distance between the assembling surface of the outer frame and the resonance plate.

7. The miniature transportation device according to claim 1, wherein the bulge is a circular convex structure, and the diameter of the bulge is 0.4 to 0.5 times the diameter of the suspension plate.

8. The miniature transportation device according to claim 1, wherein the piezoelectric element is formed in a circular shape, and has a diameter smaller than the diameter of the suspension plate.

9. The miniature transportation device according to claim 1, further comprising at least one insulation plate and a conducting plate, wherein the at least one insulation plate and the conducting plate are stacked under the piezoelectric actuator.

10. The miniature transportation device according to claim 1, further comprising a gas collecting plate, wherein the gas collecting plate comprises a first perforation, a second perforation, a first pressure-releasing chamber, a first outlet chamber and a fiducial surface, wherein the first outlet chamber has a raised structure, and the height of the raised structure is higher than the height of the fiducial surface, wherein the first perforation is in fluid communication with the first pressure-releasing chamber, and the second perforation is in fluid communication with the first outlet chamber, wherein the gas collecting plate, the piezoelectric actuator, the resonance plate and the gas inlet plate are stacked on each other sequentially, and the first chamber is defined by the chamber gap formed between the resonance plate and the piezoelectric actuator, wherein when the piezoelectric actuator is enabled, the gas is fed through the at least one inlet of the gas inlet plate into the miniature transportation device, converged through the at least one convergence channel to the convergence chamber, transferred through the central aperture of the resonance plate, introduced into the first chamber, and transferred to the gas collecting plate along the transportation direction through the at least one vacant space to be discharged continuously.

11. The miniature transportation device according to claim 10, wherein a surface of the gas collecting plate is concaved to define a gas-collecting chamber, and the gas-collecting chamber is in fluid communication with the first perforation and the second perforation.

12. The miniature transportation device according to claim 10, wherein the miniature transportation device is assembled with a miniature valve device to form a miniature fluid control device, wherein the miniature valve device comprises:
    a valve film comprising a valve opening spatially corresponding to the raised structure of the gas collecting plate; and
    a gas outlet plate comprising a pressure-releasing perforation, an outlet perforation, a second pressure-releasing chamber, a second outlet chamber and a fiducial surface, wherein the fiducial surface is concaved to define the second pressure-releasing chamber and the second outlet chamber, the pressure-releasing perforation is disposed in the center of the second pressure-releasing chamber, a raised structure is disposed around a first end of the pressure-releasing perforation, and the raised structure is raised from the fiducial surface, wherein the outlet perforation is in fluid communication with the second outlet chamber, and the second pressure-releasing chamber and the second outlet chamber is in fluid communication with each other by a communication channel;

wherein the valve film and the gas outlet plate are stacked on each other sequentially and are positioned to the gas-collecting chamber, wherein the pressure-releasing perforation is spatially corresponding to the first perforation of the gas collecting plate, the second pressure-releasing chamber is spatially corresponding to the first pressure-releasing chamber of the gas collecting plate, and the second outlet chamber is spatially corresponding to the first outlet chamber of the gas collecting plate, wherein the valve film is disposed between the gas collecting plate and the gas outlet plate and blocks the fluid communication between the first pressure-releasing chamber and the second pressure-releasing chamber, and the valve opening is disposed between the second perforation and the outlet perforation and is moved away from the raised structure of the gas collecting plate by the gas transportation, so that the gas guided in the miniature transportation device is guided through the valve opening and transferred to the outlet perforation to be discharged therefrom to perform a pressurizing operation, wherein when the discharged gas flows back through the outlet perforation, the valve opening is closed by abutting against the raised structure of the gas collecting plate, the gas subsequently flows along the communication channel to the second pressure-releasing chamber, and the gas pushes the valve film away from the raised structure of the gas outlet plate, so that the pressure-releasing perforation is opened and the gas flows out therefrom, thereby performing a gas-releasing operation.

13. The miniature transportation device according to claim 12, wherein the gas outlet plate further includes at least one position-limiting structure disposed in the second pressure-releasing chamber.

14. The miniature transportation device according to claim 12, wherein the first pressure-releasing chamber and the first outlet chamber are formed on the fiducial surface opposite to the gas-collecting chamber.

\* \* \* \* \*